United States Patent [19]

Takeda

[11] Patent Number: 5,754,275
[45] Date of Patent: May 19, 1998

[54] OPTICAL APPARATUS HAVING LENS-SYSTEM DRIVE DEVICE FOR TEMPERATURE CORRECTION IN DIRECTION OF OPTICAL AXIS

[75] Inventor: Hirohisa Takeda, Wakayama, Japan

[73] Assignee: Noritsu Koki Co., Ltd., Wakayama, Japan

[21] Appl. No.: 490,293

[22] Filed: Jun. 14, 1995

[30] Foreign Application Priority Data

Jun. 14, 1994 [JP] Japan ................... 6-132099

[51] Int. Cl.$^6$ ............... G03B 27/52; G03B 27/54
[52] U.S. Cl. ................. 355/30; 355/55; 355/67
[58] Field of Search ............... 355/55, 56, 30; 359/820

[56] References Cited

U.S. PATENT DOCUMENTS

| | | | |
|---|---|---|---|
| 4,690,528 | 9/1987 | Tanimoto | 353/101 |
| 4,699,505 | 10/1987 | Komoriya et al. | 355/30 |
| 4,815,059 | 3/1989 | Nakayama et al. | 359/820 |
| 4,825,247 | 4/1989 | Kemi et al. | 355/30 |
| 5,025,284 | 6/1991 | Komoriya et al. | 355/30 |
| 5,124,738 | 6/1992 | Yamashita | 355/56 |
| 5,270,771 | 12/1993 | Sato | 355/30 |
| 5,337,097 | 8/1994 | Suzuki et al. | 355/55 |
| 5,412,510 | 5/1995 | Iizuka et al. | 359/820 |
| 5,557,474 | 9/1996 | McCrary | 359/820 |
| 5,600,496 | 2/1997 | Mori | 359/820 |

FOREIGN PATENT DOCUMENTS

| | | |
|---|---|---|
| 0418580 | 3/1991 | European Pat. Off. |
| 5-103255 | 4/1993 | Japan. |
| 1559514 | 1/1980 | United Kingdom. |
| 2141260 | 12/1984 | United Kingdom. |

Primary Examiner—R. L. Moses
Assistant Examiner—Shival Virmani
Attorney, Agent, or Firm—Felfe & Lynch

[57] ABSTRACT

A photographic printing apparatus for printing an image projected from a film on to a photosensitive material is disclosed. The apparatus has a lens system for forming the image of the film located at an exposing position on the photosensitive material, a lens-system drive mechanism for supporting and moving the lens system along an optical axis thereof, a temperature sensor for detecting an ambience temperature around the lens-system drive mechanism, and a control device connected with the temperature sensor and the lens-system drive mechanism. The control device has a memory for storing position correction information for the lens system at each possible temperature and a driver for outputting a correction operation signal obtained based on the correction information to the lens-system drive mechanism. Depending on an operation condition of the photographic printing apparatus, a timing of outputting the correction operation signal from the driver to the lens-system drive mechanism is determined.

9 Claims, 3 Drawing Sheets

OPTICAL APPARATUS HAVING LENS-SYSTEM DRIVE DEVICE FOR TEMPERATURE CORRECTION IN DIRECTION OF OPTICAL AXIS

BACKGROUND OF THE INVENTION

The present invention relates to an optical apparatus having a lens-system drive device operable to effect a temperature correction of a lens system for forming an image on an object surface in a direction of optical axis of the system. The invention relates more particularly to a photographic printing apparatus of this type for printing an image of a film set at an exposing position onto a photosensitive material.

DESCRIPTION OF THE RELATED ART

Such lens-system drive device as noted above is used to effect a temperature correction of a lens system for forming an image on an object surface in the direction of its optical axis, in order to compensate for a drift or displacement of the imaging position of the lens system tending to result from a temperature variation. One such lens-system drive device is known from Japanese patent kokai gazette No. 5-103255. This lens-system drive device includes a lens-system drive mechanism, temperature detecting means and a control device connected with the temperature detecting means and the lens-system drive mechanism. The control device includes means for storing position correction information to be used for correcting a position of the lens system along its optical axis according to the ambient temperature. In operation, correction information is determined and obtained from the position correction information storing means based on a detected temperature. And, based on this correction information, a correction signal is outputted to the lens-system drive mechanism for correcting the position of the lens system.

Such lens-system drive device allows an instant restoration of the lens system to its proper in-focus position in accordance with a temperature variation. Then, if used in a television camera for example, the lens-system drive device allows the camera to invariably obtain a video image of good quality even when the camera is used in a location subject to critical change of the weather. On the other hand, in the case of such optical apparatus as a photographic printer, a printing operation is generally effected in the manner of batch processing on a unit processing amount, e.g. an entire single roll of negative film or a group of films spliced together. In this case, it may rather be undesirable to move the lens system for correction of its position during one continuous batch processing, if printing of e.g. one film roll throughout with uniform quality is given higher priority. Moreover, unlike the television camera which keeps shooting during the position correcting operation of its lens system, such optical apparatus as a photographic printer necessarily suspends its printing operation during a position correcting operation of the lens system. Then, if the lens system has to be moved very frequently for its position correction, the printer has to remain out of its printing service during each position correcting operation of the lens system, so that the efficiency of the printer will suffer significantly.

SUMMARY OF THE INVENTION

In an optical apparatus having the above-noted construction, namely, an optical apparatus having the temperature correction function for moving a lens system based on data relating to a lens position correction amount according to a detected ambience temperature for the purpose of compensating for a drift of the imaging position of the lens system associated with a temperature variation, an object of the present invention is to enable a timely execution of temperature correction operation.

For fulfilling the above-noted object, in an optical apparatus, according to the present invention, the control device connected with the temperature detecting means and the lens-system drive mechanism includes;
  condition recognizing means for recognizing an operation condition of the optical apparatus; and
  trigger means for determining, based on the operation condition recognized by the condition recognizing means, a timing of outputting to the lens-system drive mechanism a correction operation signal obtained from lens correction information corresponding to a detected temperature.

According to the optical apparatus of the invention having the above construction, a temperature correction process is executed only when the optical apparatus is under a predetermined operation condition. Hence, the lens system may be moved for a temperature correction at an appropriate timing.

The appropriate timing for a temperature correction operation will vary depending on the type of optical apparatus as well as on the operation condition of this apparatus. For instance, as disclosed as one preferred embodiment of the invention, if this optical apparatus is constructed as a photographic printing apparatus for printing an image projected from a film on to a photosensitive material, it is proposed that the condition recognizing means be rendered capable of recognizing a 'delimiter' condition realized chronologically between a printing operation of a last frame of a preceding film on to the photosensitive material and a subsequent printing operation of a first or leading frame of a next film on to the photosensitive material and that the trigger means allow the output of the correction operation signal to the lens-system drive mechanism while the condition recognizing means recognizes this delimiter condition. To achieve this, the optical apparatus further comprises transporting means for transporting the film through the exposing position and leading-end detecting means disposed upstream relative to the exposing position in a film transport path for detecting a leading end of a film. With this construction, if an out-of-focus condition the lens system has developed due to a temperature variation, the lens system may always be returned to its proper in-focus position each time before a printing operation of a film newly charged to the photographic printing apparatus is about to be initiated. As a result, images of the one entire roll of film, which are generally observed in series, may be printed in the same imaging condition and consequently with a substantially uniform quality.

According to a further embodiment of the invention relating also to a photographic printing apparatus, it is proposed that the condition recognizing means be rendered capable of recognizing a time-up condition realized with lapse of a predetermined time period after execution of a foregoing position correcting operation and that the trigger means allow the output of the correction operation signal to the lens-system drive mechanism while the condition recognizing means recognizes this time-up condition. To achieve this, the apparatus further comprises timer means for detecting lapse of the predetermined time period after execution of the foregoing position correcting operation. This execution timing scheme for a temperature correction is suitable in particular for a situation where the apparatus is used in an environment subject to a relatively slow temperature variation. It is further conceivable that the temperature correction operation is effected based on an average value of temperature values obtained at a plurality of different timings. This may avoid too frequent lens system movements due to short-term minor temperature variations. Accordingly, this further control scheme will be suited for a situation where the ambient temperature varies frequently but remains relatively stable on the average.

Further features and advantages of an optical apparatus of the invention will become apparent from the following description of the preferred embodiments thereof with reference to the accompanying drawings.

DESCRIPTION OF THE PREFERRED EMBODIMENTS

A photographic printing apparatus, as one preferred embodiment of this invention, will be described in details with reference to the accompanying drawings.

Figure 1:
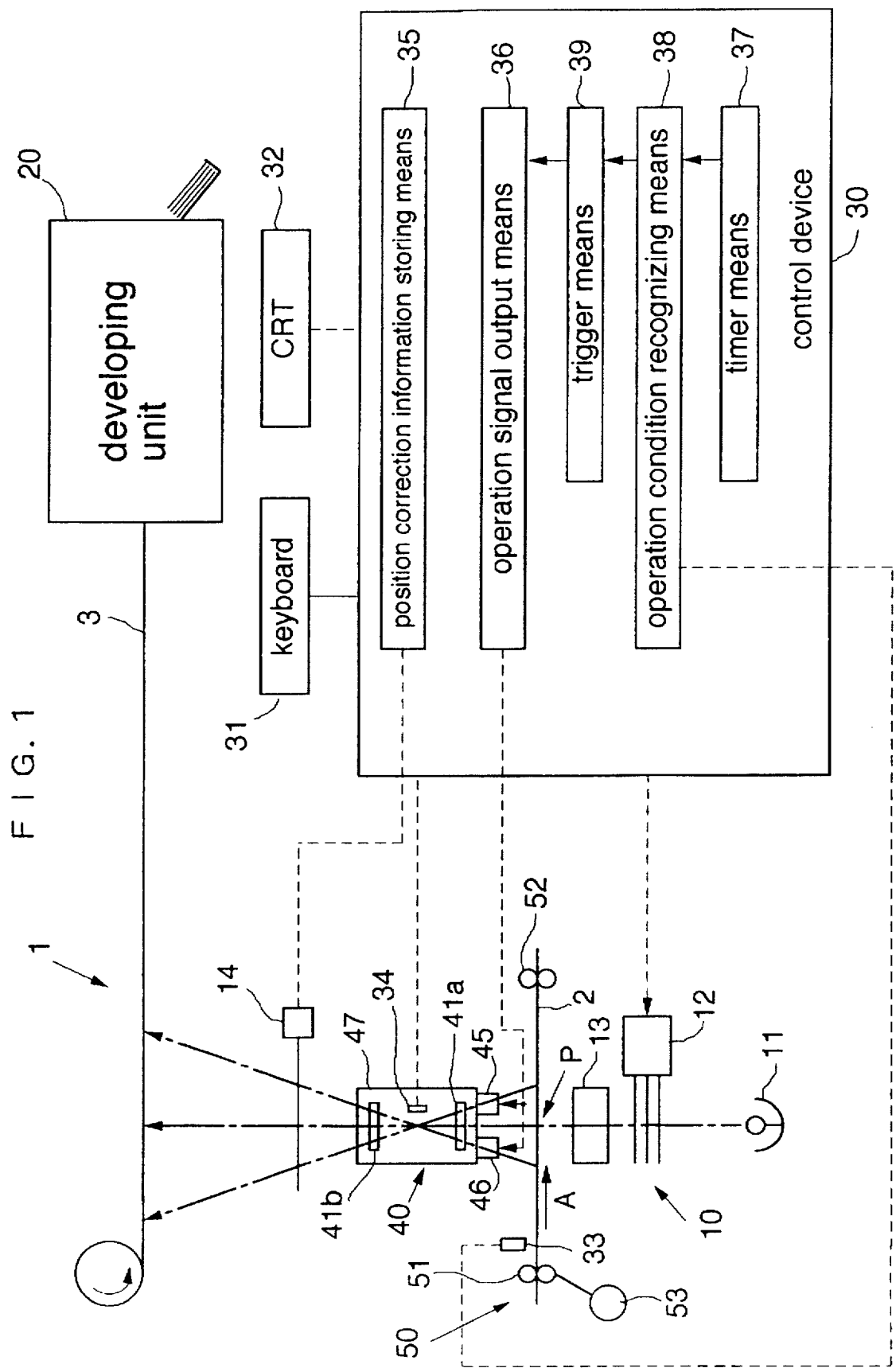
FIG. 1 is a diagrammatic view including a block diagram relating to a photographic printing apparatus according to one preferred embodiment of the invention.

A photographic printing apparatus shown in FIG. 1 includes a projection exposing unit 10 for printing an image of a film 2 on to a print paper 3 as a photosensitive material by a well-known projection exposure process, a developing unit 20 for developing the print paper 3 printed at the projection exposing unit 10 and then cutting the paper 3 into a plurality of separate print sheets, and a control device 30 for controlling various components of this photographic printing apparatus 1. The control device 30 is connected with an input device 31 such as a keyboard for allowing input of a variety of data and commands and connected also with a display device 32 such as a CRT for displaying various information.

The projection exposing unit 10 includes, as all assembled and aligned along a common optical axis, an exposure light source 11, a light modulating filter 12 for adjusting a light beam from the light source 11 to an appropriate color balance, a mirror tunnel 13 for uniformly mixing color components of the light past the modulating filter 12, a zooming lens unit 40 having a zooming lens system 41 for forming an image of the film 2 on the print paper 3, and a shutter 14. And, between the mirror tunnel 13 and the zooming lens unit 40, there is defined an exposing position P where the film 2 is to be located for its printing operation.

Across the above-noted exposing position P, there is provided a transporting means 50 for transporting the film 2 through this exposing position P. This transporting means 50 includes transporting roller pairs 51, 52 and a motor 53 for driving these rollers 51, 52 in operative connection with each other. By means of this transporting means 50, the film 2 is transported in the arrowed direction A in FIG. 1.

On the downstream of the upstream paired rollers 51, an optical type film leading-end sensor 33 is disposed as leading-end detecting means for detecting a leading end such as a leading edge of the film 2.

Upon detection of the leading end of the film 2 transported by the paired rollers 51, the leading-end sensor 33 outputs a leading-end detection signal to the control device 30 and continues outputting this signal until receiving a reset signal from the control device 30.

Figure 2:
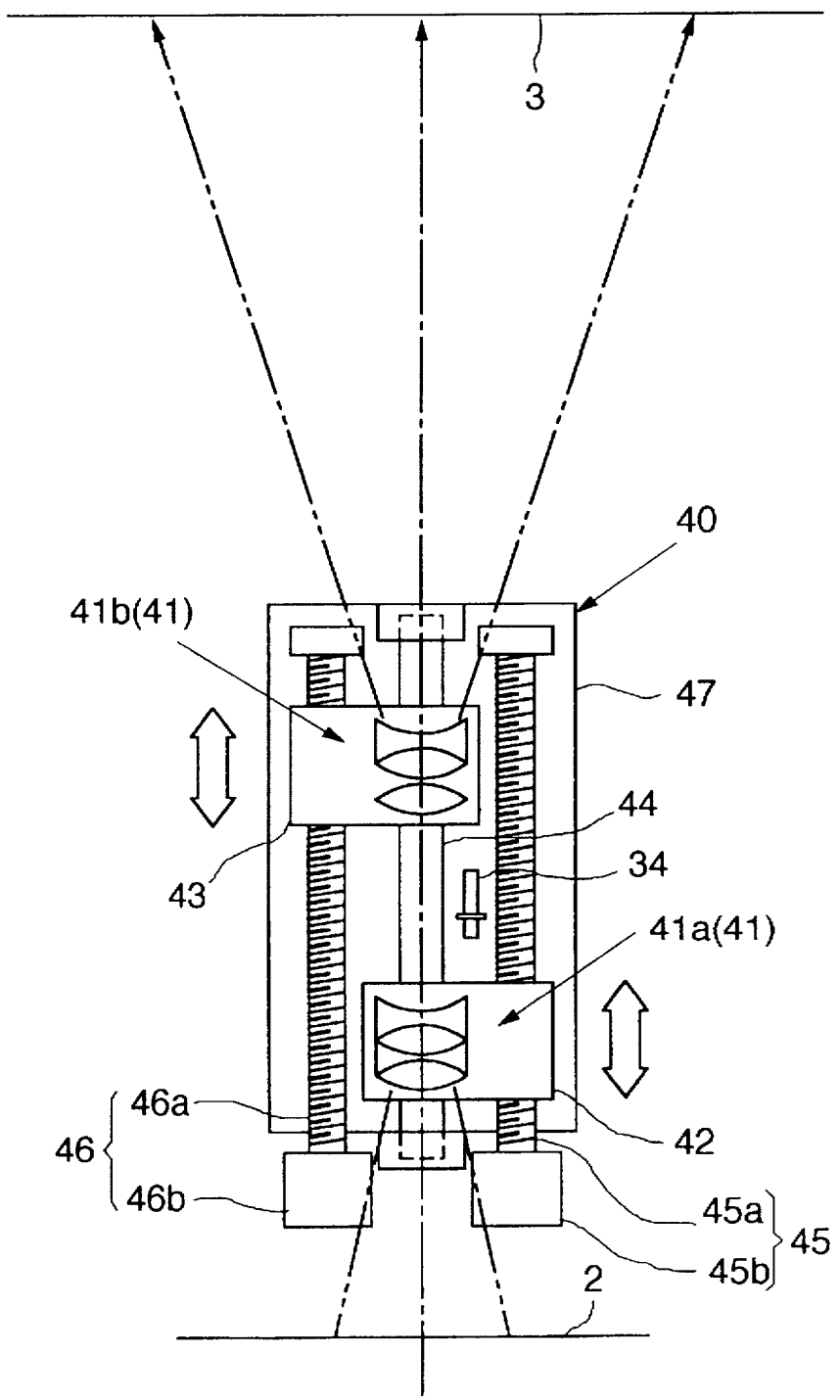
FIG. 2 is a schematic side view showing a lens-system drive mechanism used in the photographic printing apparatus of FIG. 1.

The zooming lens unit 40, as shown in FIG. 2, includes the zooming lens system 41 consisting of two lens assemblies, i.e. a fore-stage lens assembly 41a and a rear-stage lens assembly 41b, a fore-stage lens support 42 for supporting the fore-stage lens assembly 41a, a rear-stage lens support 43 for supporting the rear-stage lens assembly 41b, a linear motion guide 44 extending through both the fore-stage and rear-stage lens supports 42, 43 for slidably guiding these supports 42, 43 along the optical axis of the zooming lens system 41, fore-stage lens feed means 45 and rear-stage lens feed means 46 for reciprocating the fore-stage and rear-stage lens assemblies 41a, 41b along the optical axis of the zooming lens system 41 by moving the lens assemblies 41a, 41b together with their respective supports 42, 43 as guided along the linear motion guide 44, and a temperature sensor 34.

The fore-stage lens feed means 45 includes a fore-stage lens ball screw 45a and a fore-stage lens pulse motor 45b. The rear-stage lens feed means 46 includes a rear-stage lens ball screw 46a and a rear-stage lens pulse motor 46b. The linear motion guide 44, forestage lens ball screw 45a, rear-stage lens ball screw 46a and the temperature sensor 34 are attached to a housing 47.

The fore-stage lens pulse motor 45b and the rear-stage lens pulse motor 46b act as a drive source of the lens system moving mechanism for moving the lens system 41 in the direction of the optical axis. And, these motors 45b, 46b are independently controlled by the control device 30 to adjust the respective positions of the fore-stage and rear-stage lens assemblies 41a, 41b in such a manner as to set the zooming lens system 41 at a desired magnification and also to allow the image of the film 2 to be formed in an in-focus condition on the print paper 3.

The temperature sensor 34 is disposed at an intermediate position between the linear motion guide 44 and the fore-stage lens ball screw 45a, and functions as temperature detecting means for detecting an ambience temperature around the zooming lens system 41 or the feed means 45, 46.

The developing unit 20 includes a plurality of unillustrated processing tanks. With successive passages through these tanks, the exposed printed paper 3 is developed and then the paper is cut into separate print sheets.

The control device 30 has the function of controlling the various components of the photographic printing apparatus 1. Especially for the temperature correction of the zooming lens system 41 along the optical axis, the control device 30 includes position correction information storing means 35, operation signal output means 36, timer means 37, operation condition recognizing means 38 and trigger means 39.

The position correction information storing means 35 comprises a memory device for storing information to be used for correcting respective positions of the fore-stage lens assembly 41a and the rear-stage lens assembly 41b in accordance with an ambience temperature detected by the temperature sensor 34. More particularly, the position correction information comprises a set of values corresponding to the numbers of pulses to be transmitted to the fore-stage and rear-stage lens pulse motors 45b, 46b in order to move the respective lens assemblies 41a, 41b from its initial position to a proper position for forming an image of the film 2 in an in-focus condition on the print paper 3, i.e. the predetermined in-focus position of the zooming lens system 41. And, these values are stored in a semiconductor memory or hard disc device in a tabulated format in correlation with a variety of ambience temperatures and magnifications of the zooming lens 41. Incidentally, this position correction information may be pre-set and stored in the memory device 35 at the time of its ex-factory shipping. Alternatively, the information may be determined at the installation site of the apparatus according to possible variations of its ambience temperature and then written on the spot into a writable memory or hard disc device by using the input device 31. Still alternatively, the position correction information may be newly determined according to ambience temperature variations after running of the photographic printing apparatus 1, e.g. when a maintenance operation or a replacement of the temperature sensor 34 or the like is to be effected, so that the memory device 35 will be re-written with this newly determined information in replacement of the information previously stored therein. Furthermore, the initial information or values stored at the time of ex-factory shipping may be adjusted later by addition thereto of correction coefficients determined and stored for each particular installation site of the apparatus based on the particular ambience conditions of this installation site.

The operation signal output means 36 comprises a driver device for outputting operation signals as pulse signals to the respective pulses motors 45b, 46b of the lens-system drive mechanism based on control values determined within the control device 30. And, this signal output means 36 outputs correction operation signals in the case of a temperature correction operation.

The timer means 37 comprises a timer started upon reception of a start command determined within the control device 30 and outputting a time-up signal with lapse of a predetermined time period. In this particular embodiment, the timer means 37 keeps outputting the time-up signal until receiving a reset command from the control device 30. Upon reception of this reset signal, the timer means 37 interrupts its on-going time measuring operation and then re-starts another time measuring operation from the beginning. In other words, the reset command functions also as a start command.

The operation condition recognizing means 38 is operable to recognize an operation condition of this photographic printing apparatus 1. For instance, the recognizing means 38 is capable of recognizing a delimiter condition realized chronologically between a printing operation of a last frame of a preceding film on to the photosensitive material and a subsequent printing operation of a first frame of a next film on to the photosensitive material, or recognizing the time-up condition realized when the predetermined time period has lapsed since the execution of a previous position correction operation. For recognition of the above-noted delimiter condition, the recognizing means 38 utilizes the film leading-end detection signal from the film leading-end sensor 33 and a completion signal generated in the control device 30 indicating completion of printing of the last frame of the film which has been under the printing operation. For recognition of the time-up condition, the recognizing means utilizes the time-up signal from the timer 37.

The trigger means 39 is correlated with the above-described operation signal output means 36 and operation condition recognizing means 38, and functions to determine a timing of the output of the correction operation signal from the operation signal output means 36. More particularly, when the operation condition recognizing means 38 recognizes the above-defined delimiter condition, the trigger means 39 enables or triggers the operation signal output means 36 to output the correction operation signals to the respective pulse motors 45b, 46b of the lens-system drive mechanism. Further, when the operation condition recognizing means 38 recognizes the time-up condition, the trigger means 39 also enables the operation signal output means 36 to output the correction operation signal to the respective pulse motors 45b, 46b of the lens-system drive mechanism.

Next, the function of the photographic printing apparatus 1 having the above-described construction will be described.

As a developed film 2 is charged to the projection exposing unit 10 and then transported by the transport rollers 51, 52 to the exposing position located below the zooming lens unit 40, the light modulating filter 12 effects a color balance adjustment of exposing light beam and the shutter 14 effects an adjustment of shutter opening period, and eventually images of the film 2 are printed one after another on to the print paper 3. These operations are controlled by the control device 30.

In the above printing process, the magnification of the zooming lens unit 40 may be varied in a stepless or stepwise manner by way of the input device 31 such as a keyboard or some dedicated control tool. Then, based on this set magnification, the control device 30 controls the positions of the fore-stage and rear-stage lens assemblies 41a, 41b of the zooming lens system 41.

The print paper 3 after the printing process is then subjected to a developing process at the developing unit 20 and is cut into separate print sheets thereafter.

As described above, in addition to the control of the successive printing process of the images of the film 2 on to the print paper 3, the control device 30 is responsible also for the execution of the temperature correction operation to be effected when a temperature variation has occurred to cause a drift in the position of the zooming lens system 41 which would result in an out-of-focus imaging of the film image on the print paper 3. This correction process will be described next with reference to a flowchart of FIG. 3.

Figure 3:
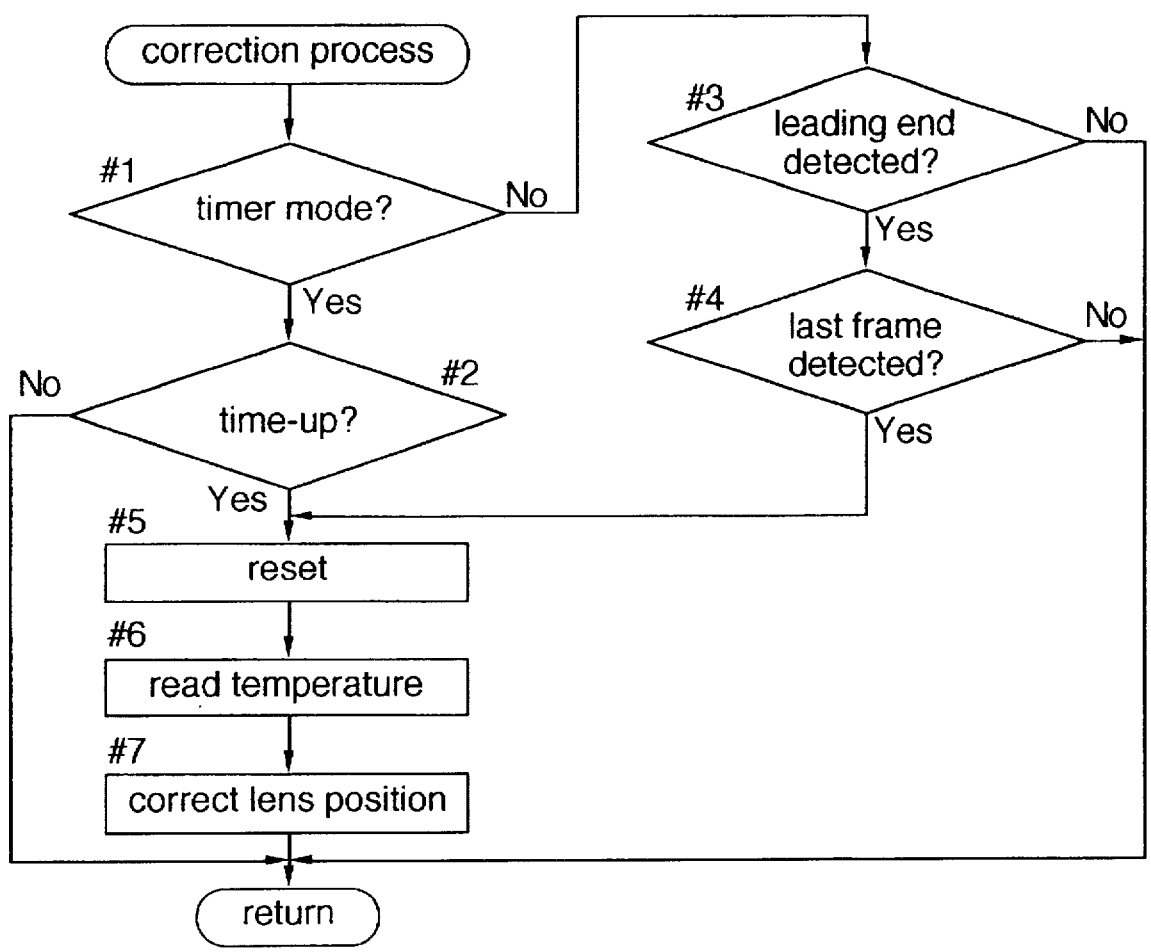
FIG. 3 is a flowchart relating to a temperature control scheme used in the photographic printing apparatus of the invention.

Incidentally, this control scheme illustrated in FIG. 3 is performed as a routine periodically branched from the other control process. Further, this correction process affords two modes, i.e. a timer mode in which the process is performed after every predetermined time period measured by the timer 37 and a sensor mode in which the process is performed each time a printing operation of a new film 2 is about to be initiated upon detection of the leading end of this film by the film leading-end sensor 33. And, selection between these two modes may be entered by the input device 31.

If the timer mode correction process is selected (step #1) and when the timer 37 outputs the time-up signal indicating lapse of the predetermined time period after the execution of the last correction process (step #2), or if the sensor mode is selected and when the leading-end detection signal is being outputted (step #3) and the printing operation of the last frame of the preceding film 2 on to the print paper 3 has been completed (step #4), namely, after the printing of the last frame of the preceding film 2 and before printing of a first frame of the next film 3 on to the print paper 3, in either case, the trigger means 39 allows execution of an actual temperature correction operation. In this temperature correction process, first the operation condition recognizing means 38 is reset, i.e. the film leading-end sensor 33 or the timer 37 is reset (step #5), and an ambience temperature detected by the temperature sensor 28 is read (step #6). Then, based on this ambience temperature and the present magnification of the zooming lens 40, the temperature correction information stored in the tabulated format within the memory device 35 is scanned to obtain a corresponding value equivalent to the number of pulses. Thereafter, a difference is calculated between the resulting value and a further value representing the number of pulses corresponding to the current positions of the fore-stage and rear-stage lens assemblies 41a, 41b. The operation signal output means 36 outputs the number of pulses corresponding to the calculated difference value to the fore-stage lens pulse motor 45b and the rear-stage lens pulse motor 46b to correct the positions of the respective lens assemblies 41a, 41b (step #7).

Incidentally, in this flow chart, the calculation of correction value is effected after the execution conditions for the temperature correction process by the trigger means 39 are met. Needless to say, as an alternative thereto, this calculation of correction value may be effected constantly provided that the correction operation signals are outputted to the pulse motors only when the conditions for the execution of temperature correction process are met. In this case, the correction operation signals may be outputted immediately after the satisfaction of the conditions for the execution of temperature correction process.

With the execution of the position correction process described above, the fore-stage lens assembly 41a and the rear-stage lens assembly 41b may respectively be restored to a proper in-focus position for forming the image of the film 2 on the print paper 3 appropriately when a critical temperature variation has occurred.

[other embodiments]

Next, some other embodiments of the invention will be specifically described.

1) In the foregoing embodiment, the zooming lens system 41 consists of two lens assemblies. Instead, the system 41 may include more than three lens assemblies. Further, a lens system other than the zooming type lens system may be employed in this invention.

2) In the foregoing embodiment, the feed means 45, 46 each comprises the combination of the ball screw and the pulse motor. Instead, a linear motor may be employed.

3) In the foregoing embodiment, the temperature sensor 34 for detecting the ambience temperature around the zooming lens system 41 or the feed means 45, 46 is disposed at a position between the linear motion guide 44 and the fore-stage lens ball screw 45a. The specific location of this temperature sensor 34 is not particularly limited to such position inside the zooming lens unit 40 as long as the sensor is capable of appropriately detecting the ambience temperature around the zooming lens system 41 or the feed means 45, 46.

Further, the temperature detecting means, embodied as the single temperature sensor in the foregoing and the above embodiments, may comprise instead a plurality of temperature sensors to be distributed at a plurality of appropriate positions. In this case, an average value will be calculated from a plurality of ambience temperature values obtained by these sensors with an appropriate weighting among these values, and this average value will be outputted as the ambience temperature around the zooming lens system 41 or the feed means 45, 46.

4) In the foregoing embodiment, the position correction information for the fore-stage lens assembly 41a and the rear-stage lens assembly 41b corresponding to the ambience temperature detected by the temperature sensor 34 comprise a set of values corresponding to the numbers of pulses to be transmitted to the fore-stage and rear-stage lens pulse motors 45b, 46b in order to move the respective lens assemblies 41a, 41b from its initial position to a proper position for forming an image of the film 2 in an in-focus condition on the print paper 3, i.e., to the predetermined in-focus position of the zooming lens system 41, and these values are determined and stored in advance in correlation with variety of ambience temperatures and magnifications of the zooming lens system 41. Alternatively, a certain ambience temperature and a corresponding in-focus position may be used as reference temperature and corresponding in-focus position. Then, when the actual temperature is detected to have deviated from the reference temperature, a number of pulses will be required for moving the zooming lens system 41 back to a predetermined in-focus position corresponding thereto. Accordingly, this number of pulses or value equivalent thereto may be stored as the position correction information.

5) Linear encoders may be provided for detecting the respective positions of the fore-stage and rear-stage lens assemblies 41a, 41b. Then, pulses outputted from these encoders may be used in place of the numbers of pulses to be transmitted to the pulse motors 45b, 46b described in the foregoing embodiment and the further embodiment described above. In this case too, like the foregoing and further embodiments, the position correction information may comprise the numbers of pulses needed for the movement of the lens system from its initial position to a predetermined in-focus position depending on the ambience temperature or the numbers of pulses needed for the restoration of the lens system to a predetermined in-focus position which is predetermined for a certain reference ambience temperature.

6) In the foregoing embodiment, the position correction process for returning the fore-stage and rear-stage lens assemblies 41a, 41b to the respective predetermined in-focus positions for appropriately forming an image of the film 2 on the print paper 3 is effected each time before a printing operation of a new film 2 is about to be initiated or effected each time when a predetermined time period has lapsed. Instead, this position correction process may be effected in both of these cases.

Further alternatively, the position correction process may be effected each time when the ambience temperature detected by the temperature sensor 34 has varied by predetermined degrees.

7) In the foregoing embodiment, the leading-end detecting means 33 detects the leading end of the film 2 by detecting the leading edge of the film 2. Instead, this leading-end detecting means may comprise, in combination, an image sensor for detecting an image-bearing portion of the film 2 by its light transmission density characteristics and a leading-end recognizing means for recognizing a leading frame of the film by utilizing a signal outputted from the image sensor.

8) In the foregoing embodiment, the print paper 3 is used as an example of the photosensitive material. But, a variety of other kinds of photosensitive materials such as a semiconductor type photosensitive member may be used instead.

The invention may be embodied in other specific forms without departing from the spirit or essential characteristics thereof. The present embodiments are therefore to be considered in all respects as illustrative and not restrictive, the scope of the invention being indicated by the appended claims rather than the foregoing description and all changes which come within the meaning and range of equivalency of the claims are therefore intended to be embraced therein.

What is claimed is:

1. An optical apparatus having a lens-system drive device operable to effect a temperature correction of a lens system for forming an image on an object surface in a direction of optical axis of the system, the lens-system drive device comprising:

a lens-system drive mechanism for supporting and moving the lens system along the optical axis;

temperature detecting means for detecting an ambient temperature around the lens-system drive mechanism; and a control device connected with the temperature detecting means and the lens-system drive mechanism, the control device including;

position correction information storing means for storing position correction information relating to a position of the lens system along the axis according to the ambient temperature, operation signal output means for reading the position correction information from the position correction information storing means based on a detection signal from the temperature detecting means and then outputting, to the lens-system drive mechanism, a correction operation signal obtained from the read position correction information and used for correction of the position of the lens system, condition recognizing means for recognizing an operation condition of the optical apparatus, and trigger means for determining a timing of the output of the correction operation signal from the operation signal output means to the lens-system drive mechanism based on the operation condition detected by the condition recognizing means.

2. A lens-system drive device as defined in claim 1, further comprising:

correction information varying means for varying the position correction information stored at the position correction information storing means.

3. A lens-system drive device as defined in claim 2, wherein said correction information varying means rewrites the position correction information stored at the position correction information storing means by using externally inputted information.

4. A photographic printing apparatus for printing an image projected from a film on to a photosensitive material, which comprises:

a lens system for forming an image of a film located at an exposing position on to the photosensitive material;

a lens-system drive mechanism for supporting and moving the lens system along an optical axis of the lens system;

temperature detecting means for detecting an ambient temperature around the lens-system drive mechanism; and a control device connected with the temperature detecting means and the lens-system drive mechanism, the control device including;

position correction information storing means for storing position correction information relating to a position of the lens system along the axis according to the ambient temperature, operation signal output means for reading the position correction information from the position correction information storing means based on a detection signal from the temperature detecting means and then outputting, to the lens-system drive mechanism, a correction operation signal obtained from the read position correction information and used for correction of the position of the lens system, condition recognizing means for recognizing an operation condition of the optical photographic printing apparatus, and trigger means for determining a timing of the output of the correction operation signal from the operation signal output means to the lens-system drive mechanism based on the operation condition detected by the condition recognizing means.

5. A photographic printing apparatus as defined in claim 4, further comprising:

transport means for transporting the film through the exposing position; and leading-end detecting means disposed upstream relative to the exposing position in a film transport path for detecting a leading end of the film, the leading-end detecting means being connected with the operation condition recognizing means;

wherein the condition recognizing means is capable of recognizing a delimiter condition realized chronologically between a printing operation of a last frame of a preceding film on to the photosensitive material and a subsequent printing operation of a first or leading frame of a next film on to the photosensitive material, and the trigger means allows the output of the correction operation signal to the lens-system drive mechanism while the condition recognizing means recognizes the delimiter condition.

6. A photographic printing apparatus as defined in claim 4, further comprising:

timer means for detecting a time-up condition realized when a predetermined time period has lapsed since the execution of a foregoing position correcting operation, the timer means being connected with the operation condition recognizing means;

wherein the condition recognizing means is capable of recognizing the time-up condition, and the trigger means allows the output of the correction operation signal to the lens-system drive mechanism while the condition recognizing means recognizes the time-up condition.

7. A lens-system drive device as defined in claim 4, wherein said control device calculates a position of the lens system relative to the image-forming object surface, and said position correction information storing means stores, as said position correction information, a value corresponding to an appropriate distance from the lens system to the image-forming object surface at each temperature, the value being set for a predetermined image-forming specific in association with each temperature.

8. A lens-system drive device as defined in claim 4, wherein said position correction information storing means stores, as said position correction information, a value for restoring an improper condition of the lens system relative to the image-forming object surface to a proper condition relative to the object surface, the improper condition being attributable to a deviation from a reference temperature.

9. A photographic printing apparatus as defined in claim 4, wherein said lens system comprises a zooming lens system.

* * * * *